(12) United States Patent
Song et al.

(10) Patent No.: US 10,018,871 B1
(45) Date of Patent: Jul. 10, 2018

(54) DISPLAY APPARATUS

(71) Applicant: Samsung Display Co., LTD., Yongin-si, Gyeonggi-Do (KR)

(72) Inventors: Hee-Kwang Song, Suwon-si (KR); Youngchun Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/700,251

(22) Filed: Sep. 11, 2017

(30) Foreign Application Priority Data

May 24, 2017 (KR) .......................... 10-2017-0064308

(51) Int. Cl.

| | | |
|---|---|---|
| *G02F 1/1335* | (2006.01) | |
| *H01L 33/06* | (2010.01) | |
| *H01L 33/24* | (2010.01) | |
| *C09K 11/06* | (2006.01) | |
| *F21V 9/16* | (2006.01) | |
| *G02F 1/13363* | (2006.01) | |
| *G02B 5/23* | (2006.01) | |
| *F21V 9/30* | (2018.01) | |

(52) U.S. Cl.
CPC ........ *G02F 1/133514* (2013.01); *C09K 11/06* (2013.01); *F21V 9/16* (2013.01); *F21V 9/30* (2018.02); *G02B 5/23* (2013.01); *G02F 1/13363* (2013.01); *G02F 1/133512* (2013.01); *G02F 1/133553* (2013.01); *H01L 33/06* (2013.01); *H01L 33/24* (2013.01)

(58) Field of Classification Search
CPC ........... G02F 1/133514; G02F 1/13363; G02F 1/133553; G02F 1/133512; F21V 9/30; F21V 9/16; G02B 5/23; C09K 11/06; H01L 33/24; H01L 33/06
See application file for complete search history.

(56) References Cited

U.S. PATENT DOCUMENTS

2017/0293183 A1* 10/2017 Seder .................... G02F 1/1368

FOREIGN PATENT DOCUMENTS

KR         101383551 B1     4/2014

* cited by examiner

*Primary Examiner* — Donald Raleigh
(74) *Attorney, Agent, or Firm* — Cantor Colburn LLP (57) ABSTRACT

A display apparatus includes a backlight unit which generates light and provides the light to a display panel which displays an image with the light, a first polarizer disposed on the backlight unit, a third polarizer disposed on the first polarizer, a second polarizer disposed between the first polarizer and the third polarizer, a light transmittance layer which blocks or transmits the light therethrough to display the image, disposed between the first polarizer and the second polarizer, and a color conversion layer disposed between the second polarizer and the third polarizer, and including a color conversion material which converts a color of light transmitted through the light transmittance layer and the second polarizer. A polarizing axis of the third polarizer is different from a polarizing axis of the second polarizer.

20 Claims, 10 Drawing Sheets

DISPLAY APPARATUS

This application claims priority to Korean Patent Application No. 10-2017-0064308, filed on May 24, 2017, and all the benefits accruing therefrom under 35 U.S.C. § 119, the content of which in its entirety is herein incorporated by reference.

BACKGROUND

1. Field

Example embodiments of the invention relate to a display apparatus. More particularly, example embodiments of the invention relate to a display apparatus having a color conversion layer.

2. Description of the Related Art

A display apparatus having a relative light weight and small size has been manufactured. A cathode ray tube ("CRT") display apparatus has been used due to a performance and a competitive price. However, the CRT display apparatus has a weakness with a size or portability thereof. Therefore a display apparatus such as a plasma display apparatus, a liquid crystal display apparatus and an organic light emitting display apparatus has been highly regarded due to a relatively small size, light weight and low-power-consumption thereof.

SUMMARY

One or more example embodiment of the invention provides a display apparatus having a backlight unit and a color conversion layer capable of improving a display quality of the display apparatus.

According to an example embodiment of the invention, a display apparatus includes a backlight unit which generates light and provides the light to a display panel which displays an image with the light, a first polarizer disposed on the backlight unit, a third polarizer disposed on the first polarizer, a second polarizer disposed between the first polarizer and the third polarizer, a light transmittance layer which blocks or transmits the light therethrough to display the image, disposed between the first polarizer and the second polarizer, and a color conversion layer disposed between the second polarizer and the third polarizer, and including a color conversion material which converts a color of light transmitted through the light transmittance layer and the second polarizer. A polarizing axis of the third polarizer is different from a polarizing axis of the second polarizer.

In an example embodiment, the polarizing axis of the third polarizer may be perpendicular to the polarizing axis of the second polarizer.

In an example embodiment, the backlight unit may generate blue light. The color conversion layer may include a blue light blocking pattern, a first color conversion pattern and a second color conversion pattern. The blue light blocking pattern may commonly overlap the first color conversion pattern and the second color conversion pattern. The first color conversion pattern may include a first color conversion material which converts the blue light to red light at a red pixel area. The second color conversion pattern may include a second color conversion material which converts the blue light to green light at a green pixel area.

In an example embodiment, the color conversion layer may further include a third color conversion pattern which transmits the blue light therethrough at a blue pixel area. The third color conversion pattern may include a scattering particle or blue pigment.

In an example embodiment, the first polarizer may convert the blue light from the backlight unit into polarized blue light to be incident to the light transmittance layer, the light transmittance layer and the second polarizer may sequentially pass the polarized blue light therethrough to be incident on the color conversion layer, at the red pixel area, the first color conversion pattern may convert a portion of the polarized blue light incident thereto into non-polarized red light and transmits a portion of the polarized blue light which is not blocked by the blue light blocking pattern, to be incident on the third polarizer at the red pixel area, at the green pixel area, the second color conversion pattern may convert a portion of the polarized blue light incident thereto into non-polarized green light and transmits a portion of the polarized blue light which is not blocked by the blue light blocking pattern, to be incident on the third polarizer at the green pixel area, and at the blue pixel area, the third color conversion pattern may convert a portion of the polarized blue light incident thereto into non-polarized blue light and transmits a remaining portion of the polarized blue light, to be incident on the third polarizer at the blue pixel area.

In an example embodiment, the third polarizer may: respectively convert the non-polarized red light, the non-polarized green light and the non-polarized blue light may be converted into polarized red light, polarized green light and polarized blue light, at the red pixel area, the green pixel area and the blue pixel area, and blocks the polarized blue light at each of the red pixel area, the green pixel area and the blue pixel area.

In an example embodiment, the display apparatus may further include a planarization layer disposed on the first color conversion pattern, the second color conversion pattern and the third color conversion pattern. The second polarizer may be a wire grid polarizer, and may be disposed on the planarization layer.

In an example embodiment, the display apparatus may further include a light recycling filter disposed between the planarization layer and the third polarizer, and respectively between the first color conversion pattern, the second color conversion pattern and the third color conversion pattern.

In an example embodiment, the display apparatus may further include a second base substrate disposed between the color conversion layer and the third polarizer. The third polarizer may be a polyvinyl alcohol polarizing plate which is attached on the second base substrate.

In an example embodiment, the display apparatus may further include a first base substrate disposed on the backlight unit, and a thin film transistor layer disposed on the first base substrate and including a pixel electrode electrically connected to the thin film transistor. The first polarizer may be a polyvinyl alcohol polarizing plate which is attached on the first base substrate or a wire grid polarizer formed on the first base substrate.

In an example embodiment, the display apparatus may further include a ¼ wave plate (quarter wave plate) disposed between the third polarizer and the color conversion layer.

In an example embodiment, the display apparatus may further include an anti-reflection film disposed on the third polarizer. The anti-reflection film may include a first layer have a first refractive index repeatedly alternated with a second layer having a second refractive index which is higher than the first refractive index.

In an example embodiment, the polarizing axis of the third polarizer and the polarizing axis of the second polarizer may form an acute angle greater than 0 degrees and less than about 90 degrees.

In an example embodiment, each of the first polarizer, the second polarizer and the third polarizer may be a linear polarizer.

According to an example embodiment of the invention, a display apparatus includes a backlight unit which generates blue light and provides the blue light to a display panel which displays an image with light, a first polarizer disposed on the backlight unit; a third polarizer disposed on the first polarizer, a second polarizer disposed between the first polarizer and the third polarizer, a light transmittance layer which blocks or transmits the light therethrough to display the image, and a color conversion layer disposed between the second polarizer and the third polarizer, and including a color conversion material which converts a color of light transmitted through the light transmittance layer and the second polarizer. A polarizing axis of the third polarizer may be different from a polarizing axis of the second polarizer. The color conversion layer may include a first color conversion pattern including a first color conversion material which converts the blue light to red light at a red pixel area, a second color conversion pattern including a second color conversion material which converts the blue light to green light at a green pixel area, a third color conversion pattern including a scattering particle to transmit blue light therethrough at a blue pixel, and a blue light blocking pattern which blocks the blue light, at the red pixel area and the green pixel area.

In an example embodiment, the polarizing axis of the third polarizer may be perpendicular to the polarizing axis of the second polarizer.

In an example embodiment, the first polarizer may convert the blue light from the backlight unit into polarized blue light to be incident to the light transmittance layer, the light transmittance layer and the second polarizer may sequentially pass the polarized blue light therethrough to be incident on the color conversion layer, at the red pixel area, the first color conversion pattern may convert a portion of the polarized blue light incident thereto into non-polarized red light, and transmit a portion of the polarized blue light which is not blocked by the blue light blocking pattern, to be incident on the third polarizer at the red pixel area, at the green pixel area, the second color conversion pattern may convert a portion of the polarized blue light incident thereto into non-polarized green light, and transmit a portion of the polarized blue light which is not blocked by the blue light blocking pattern, to be incident on the third polarizer at the green pixel area, and at the blue pixel area, the third color conversion pattern may convert a portion of the polarized blue light incident thereto into non-polarized blue light, and transmits a remaining portion of the polarized blue light, to be incident on the third polarizer at the blue pixel area.

In an example embodiment, the display apparatus may further include a ¼ wave plate disposed between the third polarizer and the color conversion layer.

In an example embodiment, the display apparatus may further include an anti-reflection film disposed on the third polarizer. The anti-reflection film may include a first layer have a first refractive index repeatedly alternated with a second layer having a second refractive index which is higher than the first refractive index.

In an example embodiment, the display apparatus may further include a planarization layer disposed on the first color conversion pattern, the second color conversion pattern and the third color conversion pattern, and a light recycling filter disposed between the planarization layer and the third polarizer, and further respectively between the first color conversion pattern, the second color conversion pattern and the third color conversion pattern. The second polarizer may be a wire grid polarizer, and is disposed on the planarization layer.

According to one or more example embodiment of the invention, a display apparatus includes a backlight unit generating light, a first polarizer disposed on the backlight unit, a third polarizer disposed on the first polarizer, a second polarizer disposed between the first polarizer and the third polarizer, a light transmittance layer disposed between the first polarizer and the second polarizer, and a color conversion layer disposed between the second polarizer and the third polarizer, and including a color conversion material that converts color of transmitted light. A polarizing axis of the third polarizer different from (e.g., is not in parallel with) a polarizing axis of the second polarizer. Accordingly, among the light that has been emitted from the backlight unit and has passed through the first polarizer, the light transmittance layer, the second polarizer, and the color conversion layer, light component which is converted into the non-polarized light by the color conversion structure in the color conversion layer can pass through the third polarizer, and light component which is not converted by the color conversion structure and had passed the second polarizer cannot pass the third polarizer. Accordingly, only desired light components can pass through the third polarizer, so that the display quality of the display device including the display apparatus can be improved.

In addition, the display apparatus can obtain a desired output color coordinate by appropriately adjusting an angle formed between the polarization axis of the third polarizer and the polarization axis of the second polarizer.

In addition, the display apparatus may further include an anti-reflection film and/or a ¼ plate to minimize reflection of external light, thereby improving display quality.

It is to be understood that both the foregoing general description and the following detailed description are exemplary and explanatory and are intended to provide further explanation of the invention as claimed

BRIEF DESCRIPTION OF THE DRAWINGS

The above and other features of the invention will become more apparent by describing in detail example embodiments thereof with reference to the accompanying drawings, in which.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A display apparatus which displays an image with light may include a backlight unit which provides the light and a color conversion layer using quantum dots. The display apparatus may impart a desired color to the image by the color conversion layer, and improve color reproducibility and luminous efficiency of the image, so that display quality may be improved. However, there has been a problem that the display quality of the display apparatus deteriorates due to unintentional leakage of light generated in the backlight unit such that the leaked light is not converted into light of a desired color by the color conversion layer.

Hereinafter, example embodiments of the invention will be explained in detail with reference to the accompanying drawings.

Figure 1:
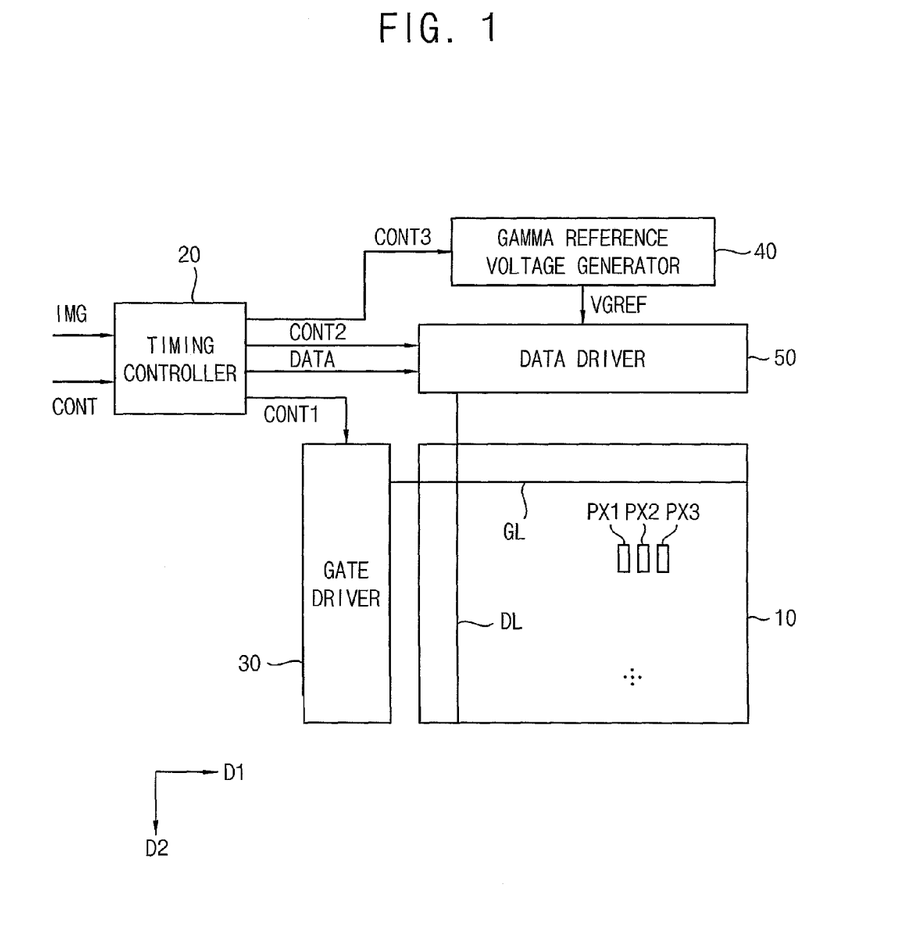
FIG. 1 is a block diagram illustrating an example embodiment of a display apparatus according to the invention.

FIG. 1 is a block diagram illustrating an example embodiment of a display apparatus according to the invention.

Referring to FIG. 1, the display apparatus may include a display panel 10 and a display panel driver. The display panel driver may collectively include a timing controller 20, a gate driver 30, a gamma reference voltage generator 40 and a data driver 50. The display apparatus may further include a backlight unit (refers to BLU of FIG. 2). The display panel 10 displays an image with light provided by the backlight unit. The display panel driver provides control and/or driving signals to the display panel 10 which uses such signals to display the image with the light.

The display panel 10 may include a gate line GL, a data line DL and a pixel electrically connected to the gate line GL and the data line DL. The signals of the display panel driver may be transmitted through the gate and data lines GL and DL, to operate the pixel to display an image. A switching element of the pixel may be connected to the gate line GL and the data line DL. A pixel electrode is disposed in the pixel and may be connected to the switching element. The gate line GL, the data line DL, the switching element, the pixel electrode, and the pixel may each be provided in plurality within the display panel 10. The gate lines GL may define a length thereof extended in a first direction D1 and the data lines DL may define a length thereof extended in a second direction D2 crossing the first direction D1. The display panel 10 and the overall display apparatus is disposed in planes which are parallel to a plane defined by the first and second directions D1 and D2. A thickness of elements of the display apparatus and the overall display apparatus is defined in a third direction which crosses each of the first and second directions D1 and D2.

The display panel 10 may include a first (display) substrate, a second (display) substrate facing the first substrate, and an optical control or transmittance layer such as a liquid crystal layer disposed between the first substrate and the second substrate. The gate lines, the data lines, the pixel electrodes of the pixels and the switching elements may be disposed or formed in the first substrate such as on a base substrate thereof. A common electrode may be disposed or formed in the second substrate such as on a base substrate thereof.

The timing controller 20 may receive input image data IMG and an input control signal CONT from an external apparatus (not shown). The input image data may include red image data, green image data and blue image data. The input control signal CONT may include a master clock signal and a data enable signal. The input control signal CONT may further include a vertical synchronizing signal and a horizontal synchronizing signal.

The timing controller 20 may generate a first control signal CONT1, a second control signal CONT2, a third control signal CONT3 and a data signal DATA based on the input image data IMG and the input control signal CONT.

The timing controller 20 may generate the first control signal CONT1 for controlling an operation of the gate driver 30 based on the input control signal CONT, and outputs the first control signal CONT1 to the gate driver 30. The first control signal CONT1 may further include a vertical start signal and a gate clock signal.

The timing controller 20 may generate the second control signal CONT2 for controlling an operation of the data driver 50 based on the input control signal CONT, and outputs the second control signal CONT2 to the data driver 50. The second control signal CONT2 may include a horizontal start signal and a load signal.

The timing controller 20 may generate the data signal DATA based on the input image data IMG. The timing controller 20 may output the data signal DATA to the data driver 50.

The timing controller 20 may generate the third control signal CONT3 for controlling an operation of the gamma reference voltage generator 40 based on the input control signal CONT, and output the third control signal CONT3 to the gamma reference voltage generator 40.

The gate driver 30 may generate gate signals driving the gate lines GL in response to the first control signal CONT1 received from the timing controller 20. The gate driver 300 may sequentially output the gate signals to the gate lines GL.

The gamma reference voltage generator 40 may generate a gamma reference voltage VGREF in response to the third control signal CONT3 received from the timing controller 200. The gamma reference voltage generator 40 may provide the gamma reference voltage VGREF to the data driver 50. The gamma reference voltage VGREF may have a value corresponding to a level of the data signal DATA.

In an exemplary embodiment, the gamma reference voltage generator 40 may be disposed in the timing controller 20 or in the data driver 50.

The data driver 50 may receive the second control signal CONT2 and the data signal DATA from the timing controller 20, and receive the gamma reference voltages VGREF from the gamma reference voltage generator 40. The data driver 50 may convert the data signal DATA into data voltages having an analog type using the gamma reference voltages VGREF. The data driver 50 may output the data voltages to the data lines DL.

The display apparatus may include a plurality of pixel areas arranged in a matrix form. The pixel areas may include a first pixel area PX1, a second pixel area PX2 and a third pixel area PX3 which are disposed adjacent to each other. A light blocking area may be disposed or formed between the first to third pixel areas PX1 to PX3.

Figure 2:
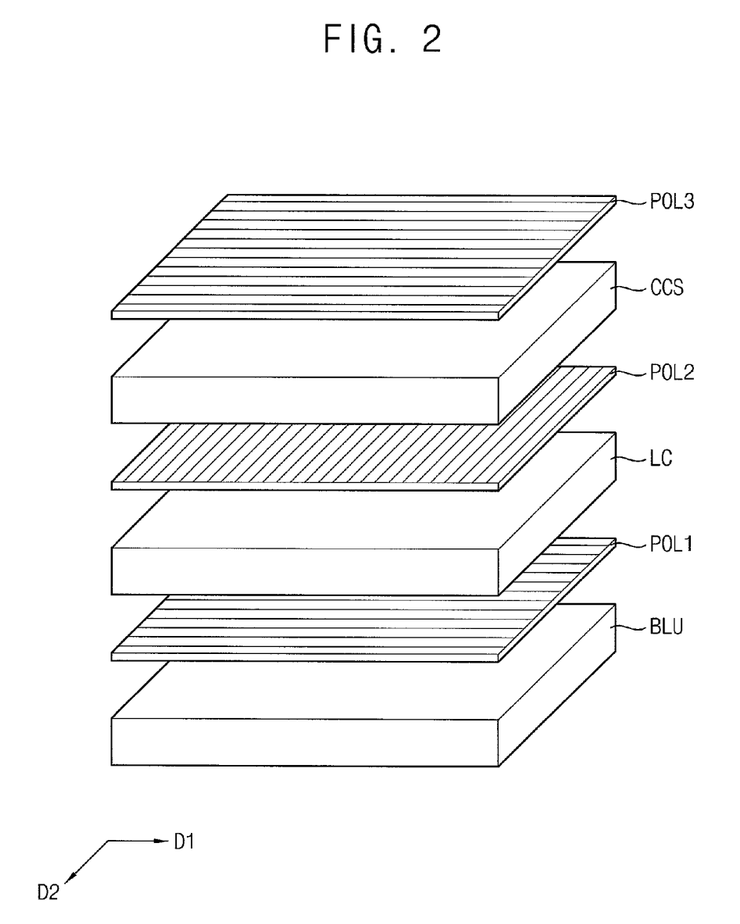
FIG. 2 is an exploded perspective view illustrating an example embodiment of elements of the display apparatus of FIG. 1.

FIG. 2 is an exploded perspective view illustrating an example embodiment of elements of the display apparatus of FIG. 1.

Referring to FIG. 2, the display apparatus may include a backlight unit BLU, a first polarizer POL1, a liquid crystal layer LC, a second polarizer POL2, a color conversion layer CCS and a third polarizer POL3. These elements may be disposed in the above order in a direction in which light travels through the display apparatus or in which the image is displayed. The elements described above, except for the backlight unit BLU, may collectively form a display panel (refers to 10 of FIG. 1).

The backlight unit BLU may be disposed under the first polarizer POL1, and may generate and provide light to the first polarizer POL1 and the liquid crystal layer LC. More particularly, the backlight unit BLU may generate blue light in a blue wavelength band to provide the blue light to the liquid crystal layer LC.

The first polarizer POL1 may be disposed on the backlight unit BLU. The first polarizer POL1 may be a linear polarizer which can linearly polarize light passing therethrough. The first polarizer POL1 may be an absorption type polarizing plate such as a general polyvinyl alcohol ("PVA") polarizing plate or a reflection type polarizing plate such as a wire grid polarizing element. The liquid crystal layer LC may include liquid crystal molecules having optical anisotropy. The liquid crystal molecules are driven by electric field, so that an image is displayed by passing or blocking light through the liquid crystal layer LC.

The second polarizer POL2 may be disposed on the liquid crystal layer LC. The second polarizer POL2 may be a linear polarizer which can linearly polarize light passing therethrough. The second polarizer POL2 may be an absorption type polarizing plate such as a general polyvinyl alcohol ("PVA") polarizing plate or a reflection type polarizing plate such as a wire grid polarizing element.

The color conversion layer CCS may be disposed on the second polarizer POL2. The color conversion layer CCS may include a color conversion structure such as a quantum dot, a phosphor and a nano-cell for converting color of transmitted light.

The third polarizer POL3 may be disposed on the color conversion layer CCS. The third polarizer POL3 may be a linear polarizer which can linearly polarize light passing through. The third polarizer POL3 may be an absorption type polarizing plate such as a general polyvinyl alcohol ("PVA") polarizing plate or a reflection type polarizing plate such as a wire grid polarizing element.

The groups of lines at the first to third polarizers POL1 to POL3 indicate a direction of a polarizing axis of a respective polarizer. Here, a polarizing axis of the third polarizer POL3 may be disposed perpendicular to a polarizing axis of the second polarizer POL2. Thus, when the polarizing axis of the second polarizer POL2 is in parallel with a second direction D2, the polarizing axis of the third polarizer POL3 may be in parallel with a first direction D1 which is perpendicular to the second direction D2.

Accordingly, among the light that has been emitted from the backlight unit BLU and has passed through the first polarizer POL1, the liquid crystal layer LC, the second polarizer POL2 and the color conversion layer CCS, a light component which is converted into the non-polarized light by the color conversion structure in the color conversion layer CCS can pass through the third polarizer POL3, and a light component which is not converted by the color conversion structure and has passed the second polarizer POL2 cannot pass the third polarizer POL3. Accordingly, only a desired light component can pass through the third polarizer POL3, so that the display quality of the display device can be improved.

Figure 3:
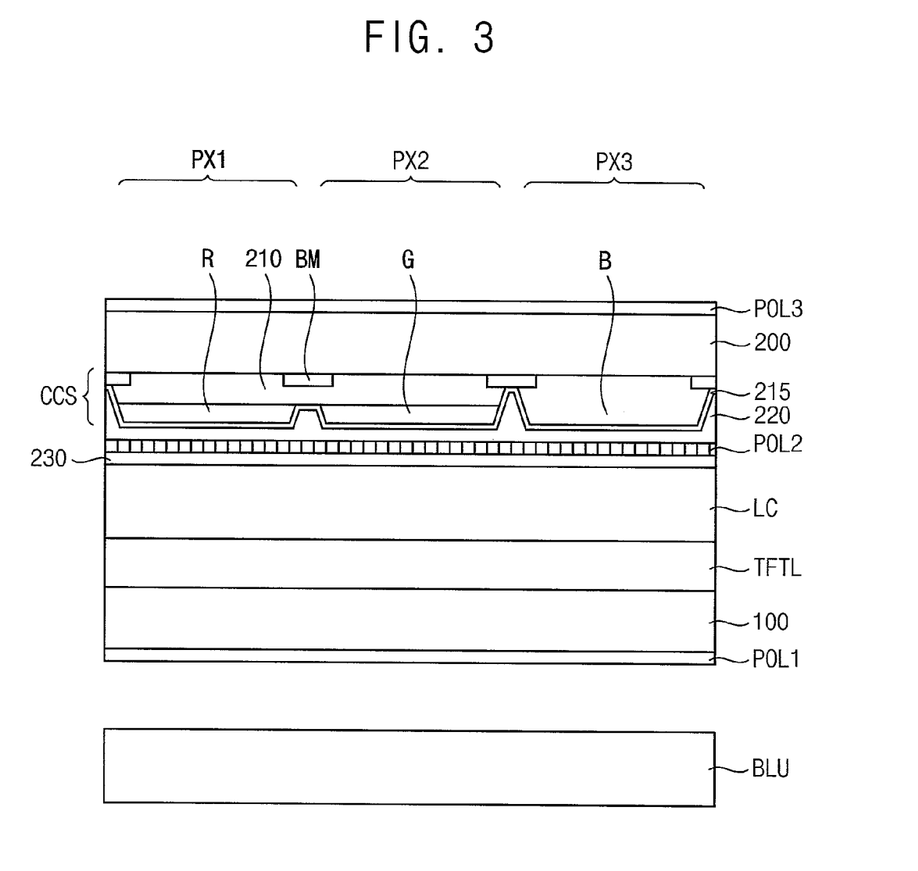
FIG. 3 is a cross-sectional view illustrating the display apparatus of FIG. 2.

FIG. 3 is a cross-sectional view illustrating the display apparatus of FIG. 2.

Referring to FIG. 3, the display apparatus may include a backlight unit BLU, a first polarizer POL1, a first base substrate 100, a thin film transistor layer TFTL, a liquid crystal layer LC, a capping layer 230, a second polarizer POL2, a planarization layer 220, a light recycling filter 215, a first color conversion layer R, a second color conversion layer G, a third color conversion layer B, a blue light blocking pattern 210, a light blocking pattern BM, a second base substrate 200 and a third polarizer POL3.

The backlight unit BLU may be disposed under the first polarizer POL1, and may generate and provide light to the first polarizer POL1 and the liquid crystal layer LC. More particularly, the backlight unit BLU may generate blue light and provide the blue light to the liquid crystal layer LC. In an example embodiment, for example, the backlight unit BLU may include a light source having a light emitting diode ("LED") generating blue light.

The first base substrate 100 may be disposed on the backlight unit BLU. The first base substrate 100 may include a transparent insulation substrate. In an example embodiment, for example, the first base substrate 100 may include a glass substrate, a quartz substrate, a transparent resin substrate, etc. Examples of the transparent resin substrate for the first base substrate 100 may include polyimide-based resin, acryl-based resin, polyacrylate-based resin, polycarbonate-based resin, polyether-based resin, sulfonic acid containing resin, polyethyleneterephthalate-based resin, etc.

The first polarizer POL1 may be disposed between the first base substrate 100 and the backlight unit BLU. The first polarizer POL1 may be an absorbing type polarizing plate such as a general polyvinyl alcohol ("PVA") polarizing plate which is attached on the first base substrate 100. In an example embodiment, the first polarizer POL1 may be a reflection type polarizing plate such as a wire grid polarizer which is disposed or formed on the first base substrate 100.

The thin film transistor layer TFTL may be disposed on the first base substrate 100. Although not shown in the figures, the thin film transistor layer TFTL may include a signal line for driving the display apparatus such as gate line and data line, and a switching element like a thin film transistor electrically connected to the signal line and having a gate electrode, an active pattern, a source electrode and a drain electrode. The thin film transistor may be electrically connected to a pixel electrode. The thin film transistor and the pixel electrode may be formed corresponding to a first pixel area PX1, a second pixel area PX2 and a third pixel area PX3, respectively.

The second base substrate 200 may be disposed opposite to the first base substrate 100. The second base substrate 200 may include a transparent insulation substrate. In an example embodiment, for example, the second base substrate 200 may include a glass substrate, a quartz substrate, a transparent resin substrate, etc. Examples of the transparent resin substrate for the second base substrate 200 may include polyimide-based resin, acryl-based resin, polyacrylate-based resin, polycarbonate-based resin, polyether-based resin, sulfonic acid containing resin, polyethyleneterephthalate-based resin, etc.

The light blocking pattern BM may be disposed on the second base substrate 200. The light blocking pattern BM may be formed in a lattice shape in a top plane view to be disposed respectively between the first, second and third pixel areas PX1, PX2 and PX3 to separate the pixel areas. The light blocking pattern BM may include a light blocking material. Here, the first, second, and third pixel areas PX1, PX2 and PX3 are regions where light for displaying an image is generated and/or transmitted. That is, the image may be displayed at the pixel areas within an overall display area of the display apparatus.

The blue light blocking pattern 210 may be disposed on the second base substrate 200 on which the light blocking pattern BM is disposed. The blue light blocking pattern 210 may be disposed or formed in the first pixel area PX1 and the second pixel area PX2. A single on blue light blocking pattern 210 may be common to both the first and second pixels areas PX1 and PX2, but the invention is not limited thereto. In an example embodiment, the blue light blocking pattern 210 may be formed by alternately laminating at least two layers having different refractive indices, in a thickness direction of the display apparatus. A wavelength band of transmitted light excluding a wavelength band of blue light can be transmitted through the blue light blocking pattern 210 and the wavelength band of blue light may be blocked by the blue light blocking pattern 210. The blue light which is blocked by the blue light blocking pattern 210 may be reflected and optical recycled.

The first color conversion pattern R may be disposed on the blue light blocking pattern 210 in the first pixel area PX1. The first color conversion pattern R may convert blue light provided from the backlight unit BLU to red light. In an example embodiment, for example, the first color conversion pattern R may include a color conversion material such as red quantum dot particles and/or red phosphor.

The second color conversion pattern G may be disposed on the blue light blocking pattern 210 in the second pixel area PX2. The second color conversion pattern may convert blue light provided from the backlight unit BLU to green light. In an example embodiment, for example, the second color conversion pattern G may include a color conversion material such as green quantum dot particles and/or green phosphor.

The red or green quantum dot may be a material that has a nano-scaled structure and may include several hundred to several thousand atoms. Since the quantum dot is relatively very small in size, a quantum confinement effect may occur. The quantum confinement effect may indicate that an energy band gap of an object is increased when the object becomes smaller than nano size. When the light having energy higher than that of the band gap is incident to the quantum dot, the quantum dot may absorb the light and may emit a second light having a specific wavelength and an energy level in the ground state. The wavelength of the emitted second light may have a value corresponding to the band gap. When a size and a composition of the quantum dot are adjusted, the emission property of the quantum dot may be controlled by the quantum confinement.

The composition of the quantum dots is not limited to a specific composition, and any suitable composition may be used. In an example embodiment, for example, the quantum dot may be a quantum dot of Group II-VI elements, Group III-V elements, Group IV elements, or Group IV-VI elements. The Group II elements may be selected from at least one of zinc, cadmium, and mercury. The group III elements may be selected from the group consisting of at least one of aluminum, gallium, and indium. The Group IV elements may be selected from at least one of silicon, germanium, tin, and lead. The Group V elements may be selected from at least one of nitrogen, phosphorus, and arsenic. The Group VI elements may be selected from at least one of sulfur, selenium, and tellurium.

The third color conversion pattern B may be disposed on the second base substrate 200 in the third pixel area PX3. The third color conversion pattern B may include scattering particles that change a traveling direction of light passing therethrough without changing the color of the light. A size of the scattering particle may be similar to the size of red quantum dot particle or green quantum dot particle. In addition, the third color conversion pattern B may further include blue pigment for converting light passing therethrough to blue light.

The planarization layer 220 may be commonly disposed on the first color conversion pattern R, the second color conversion pattern G and the third color conversion pattern B. The planarization layer 220 may provide a flat upper surface on the first color conversion pattern R, the second color conversion pattern G and the third color conversion pattern B. The planarization layer 220 may include organic or inorganic insulation material.

The light recycling filter 215 may be respectively disposed between the planarization layer 220, and each the first color conversion pattern R, the second color conversion pattern G and the third color conversion pattern B. The light recycling filter 215 may be a yellow light recycling filter. The light recycling filter 215 may reflect light which is generated from the backlight unit BLU and reflected by the first to third color conversion patterns R, G and B, and the blue light blocking pattern 210 toward the liquid crystal layer LC, so that brightness of the display apparatus can be improved.

The second polarizer POL2 may be disposed on the planarization layer 220. The second polarizer POL2 may be a wire grid polarizer. The wire grid polarizer may include a plurality of relatively fine lines lengthwise extending in one direction, which are formed of metal and are arranged at regular intervals along the polarization layer 220. The fine lines may have a pitch of about 50 nanometers (nm) to about 150 nm. The pitch refers to sum of a width of one fine line and a distance between adjacent fine lines. In an example embodiment, the second polarizer POL2 may be a general polyvinyl alcohol ("PVA") polarizing plate similar to the first polarizer POL1.

The capping layer 230 may be disposed on the second polarizer POL2 for capping or covering the second polarizer POL2. The capping layer 230 may include organic or inorganic insulation material.

The liquid crystal layer LC may be disposed between the capping layer 230 and the thin film transistor layer TFTL. The liquid crystal layer LC may include liquid crystal molecules having optical anisotropy. The liquid crystal molecules are driven by electric field, so that an image is displayed by passing or blocking light through the liquid crystal layer LC.

The third polarizer POL3 may be disposed on the second base substrate 200. The third polarizer POL3 may be an absorbing type polarizing plate such as a general polyvinyl alcohol ("PVA") polarizing plate or a reflection type polarizing plate such as a wire grid polarizer. Here, a polarizing axis of the third polarizer POL3 may be disposed perpendicular to a polarizing axis of the second polarizer POL2.

Although not shown in the figures, the display apparatus may further include a common electrode disposed on the capping layer 230 according to a driving mode of the display apparatus. In addition, the display apparatus may further include upper and lower alignment layers (not shown) disposed respectively above and under the liquid crystal layer LC to set an initial alignment direction of the liquid crystal molecules.

Figure 4:
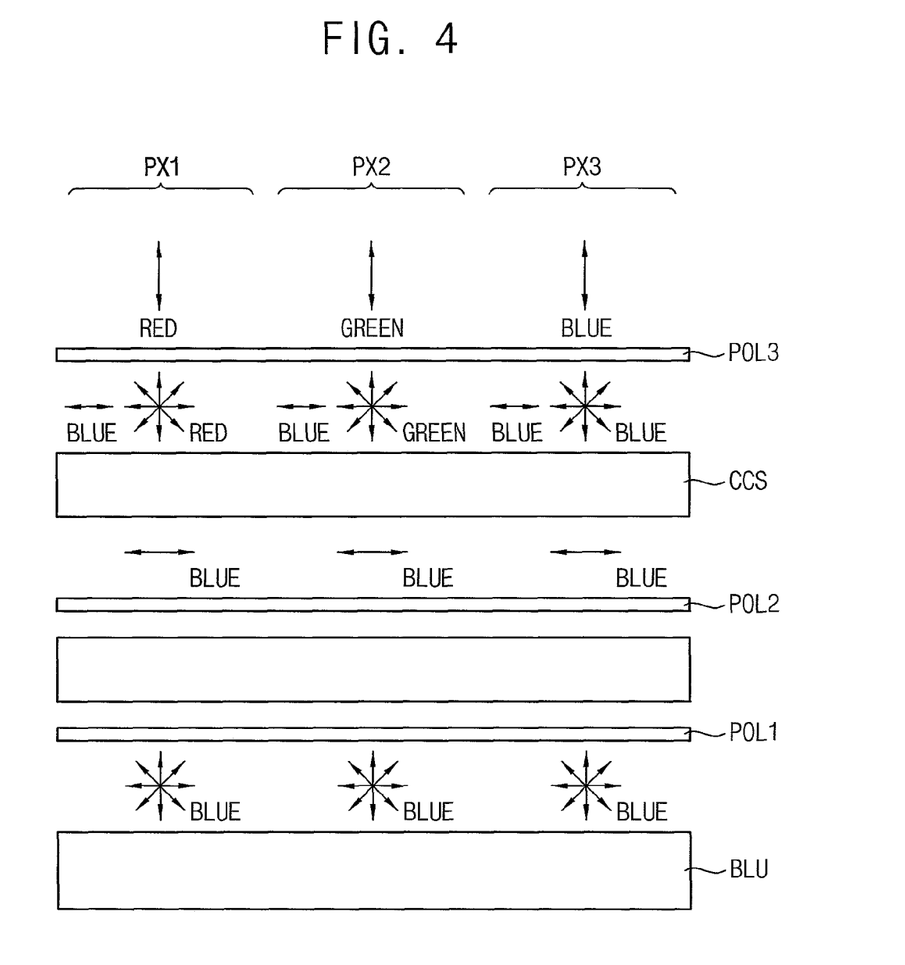
FIG. 4 is a cross-sectional view illustrating an example embodiment of operation of the display apparatus of FIG. 2.

FIG. 4 is a cross-sectional view illustrating an example embodiment of operation of the display apparatus of FIG. 2. The unlabeled element in FIG. 4 between the first and second polarizers POL1 and POL2 represents a relative location of the liquid crystal layer LC, and also may represent a collection of the first base substrate 100, thin film transistor layer TFTL and the liquid crystal layer LC detailed in FIG. 3.

Referring to FIG. 4, a blue light generated from the backlight unit BLU is in a non-polarized state, as shown by the multiple sets of arrows labeled "BLUE." The blue light in the non-polarized state passes the first polarizer POL1, the liquid crystal layer LC and the second polarizer POL2, and is converted into polarized blue light as shown by the horizontal arrows labeled "BLUE."

The polarized blue light which had passed the second polarizer POL2 passes the color conversion layer CCS, so that it is converted into non-polarized red light in the first pixel area PX1, non-polarized green light in the second pixel area PX2 and non-polarized blue light in the third pixel area PX3. Here, undesired polarized blue light in the first pixel area PX1 and the second pixel area PX2 may pass through the color conversion layer CCS with polarized state. This may occur because the blue light blocking pattern (see 210 in FIG. 3) cannot completely block the blue light. In addition, since third pixel area PX3 corresponds to a blue pixel emitting blue light, there is no problem of deterioration of display quality due to such out-flowed undesirable polarized blue light.

The out-flowed undesirable polarized blue light in the first and second areas PX1 and PX2 may undesirably deform the color coordinates of the image of the display apparatus, so that the display quality may be deteriorated. However, the light having passed through the color conversion layer CCS passes through the third polarizer POL3 to outside the display apparatus and is recognized by the user. The polarizing axis of the third polarizer POL3 is perpendicular to the polarizing axis of the second polarizer POL2, so that the out-flowed undesirable polarized blue light cannot pass through the third polarizer POL3. Thus the problem of deformation of the color coordinates can be solved. Therefore, the display quality of the display apparatus may be improved.

Figure 5:
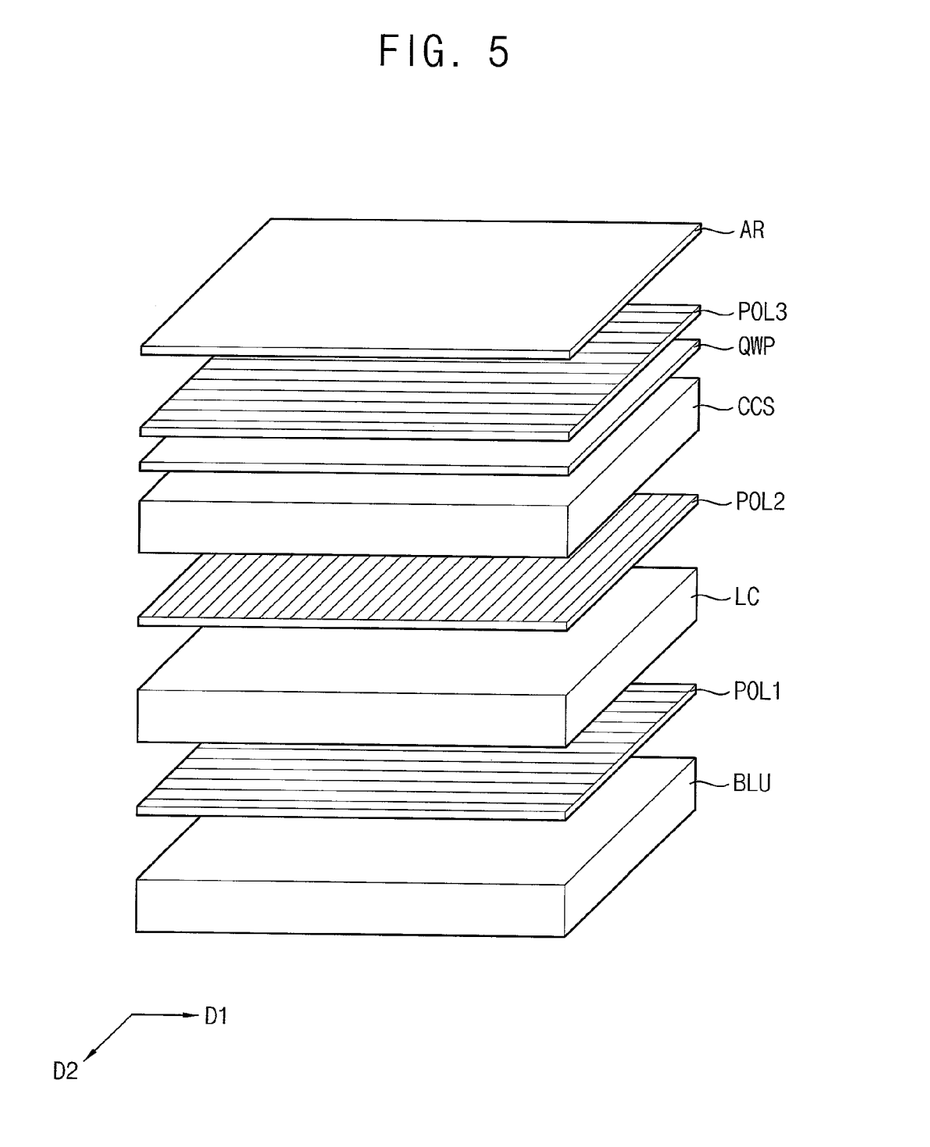
FIG. 5 is an exploded perspective view illustrating another example embodiment of elements of a display apparatus according to the invention.
Figure 6:
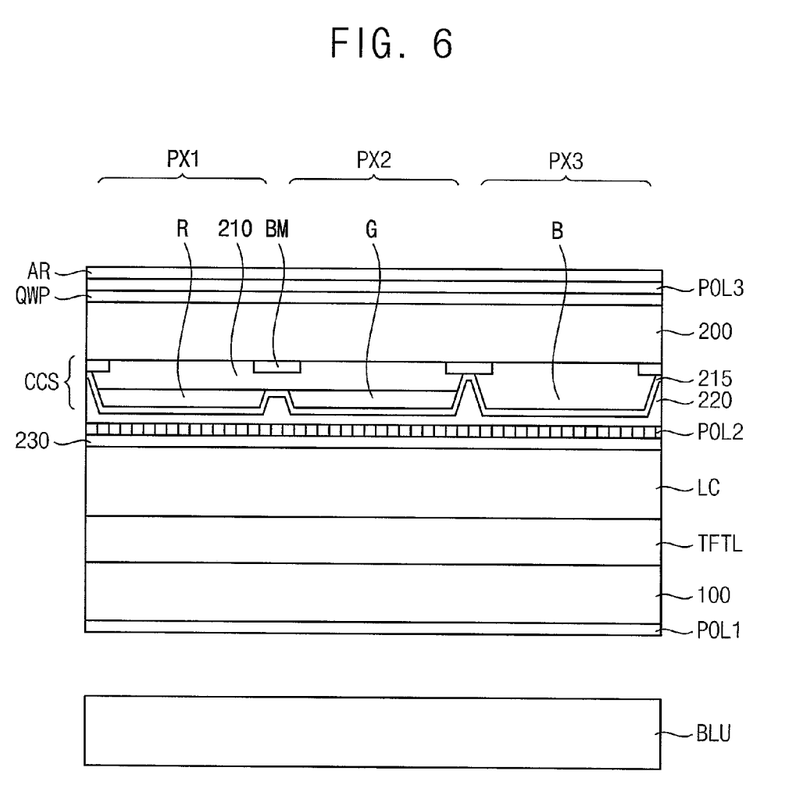
FIG. 6 is a cross-sectional view illustrating the display apparatus of FIG. 5.

FIG. 5 is an exploded perspective view illustrating another example embodiment of elements of a display apparatus according to the invention. FIG. 6 is a cross-sectional view illustrating the display apparatus of FIG. 5.

Referring to FIGS. 5 and 6, the display apparatus may be substantially same as the display apparatus of FIGS. 3 and 4, except that the display apparatus further include an anti-reflection film AR and ¼ wave plate QWP. Therefore, repeated description will be omitted.

The display apparatus may include a backlight unit BLU, a first polarizer POL1, a liquid crystal layer LC, a first base substrate 100, a thin film transistor layer TFTL, a liquid crystal layer LC, a capping layer 230, a second polarizer POL2, a planarization layer 220, a light recycling filter 215, a color conversion layer CCS, a light blocking pattern BM, a second base substrate 200, a ¼ wave plate QWP, a third polarizer POL3 and an anti-reflection film AR. The color conversion layer CCS may include a first color conversion pattern R, a second color conversion pattern G, a third color conversion pattern B and a blue light blocking pattern 210.

The ¼ wave plate QWP (quarter wave plate) may be disposed between the third polarizer POL3 and the second base substrate 200. The ¼ wave plate QWP may be a quarter wave retarder that converts a phase of transmitted light by a ¼ wavelength. The ¼ wave plate QWP and the third polarizer POL3 can prevent reflection by external light incident from the outside of the display apparatus. In an example embodiment, for example, the external light passes from outside the display apparatus at a viewing side thereof, through the third polarizer POL3 and the ¼ wave plate QWP in order, is reflected by internal structures of the display apparatus, and passes through the ¼ wave plate QWP again. Here, the external light having passed through the ¼ wave plate QWP twice cannot be transmitted through the third polarizer POL3 because the phase is changed by 90 degrees. Thus the external light cannot be released back to the outside of the display apparatus and is not viewed by a user.

The anti-reflection film AR may be disposed on the third polarizer POL3. The anti-reflection film AR may form an outer (display) surface or element of the overall display apparatus. In an example embodiment of manufacturing the display apparatus, the anti-reflection film AR may be formed by alternately and repeatedly arranging a low refractive index layer having a relatively small refractive index and a high refractive index layer having a relatively large refractive index. Reflection at a (viewing or display) surface of the display apparatus can be reduced by the destructive interference effect.

Figure 7:
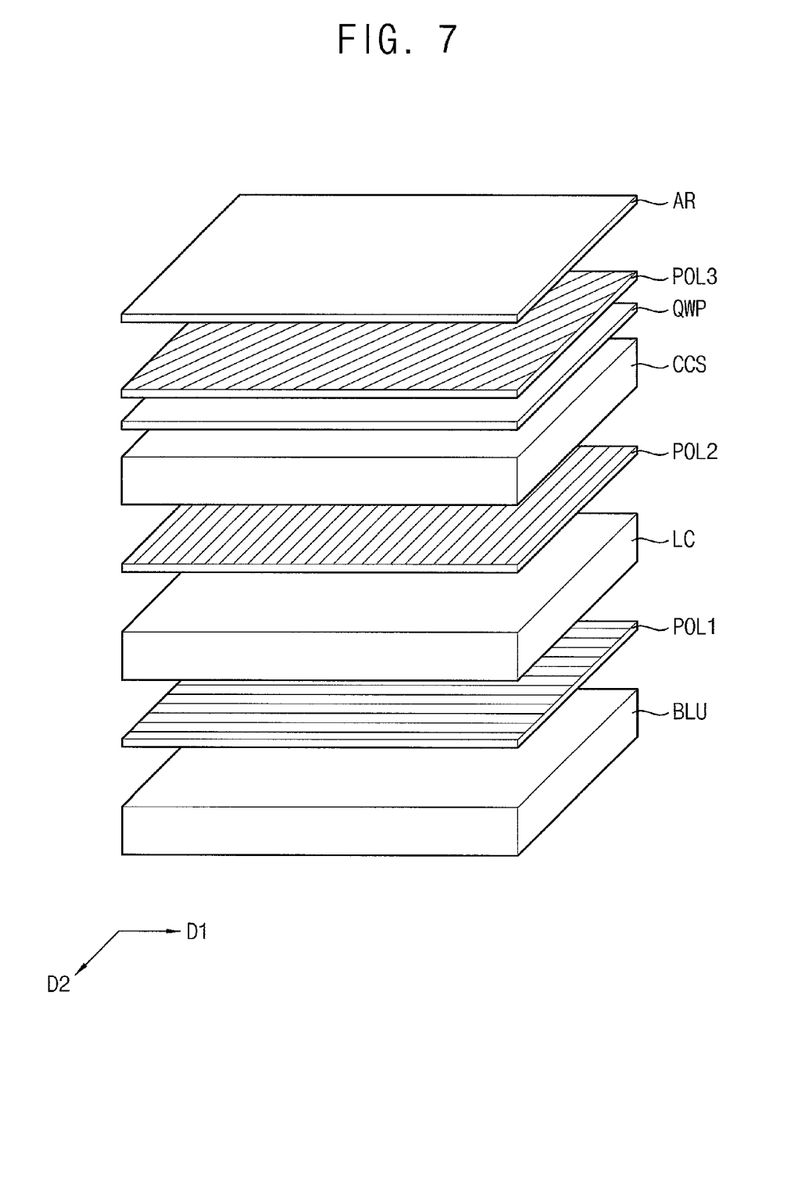
FIG. 7 is an exploded perspective view illustrating still another example embodiment of elements of a display apparatus according to the invention.
Figure 8:
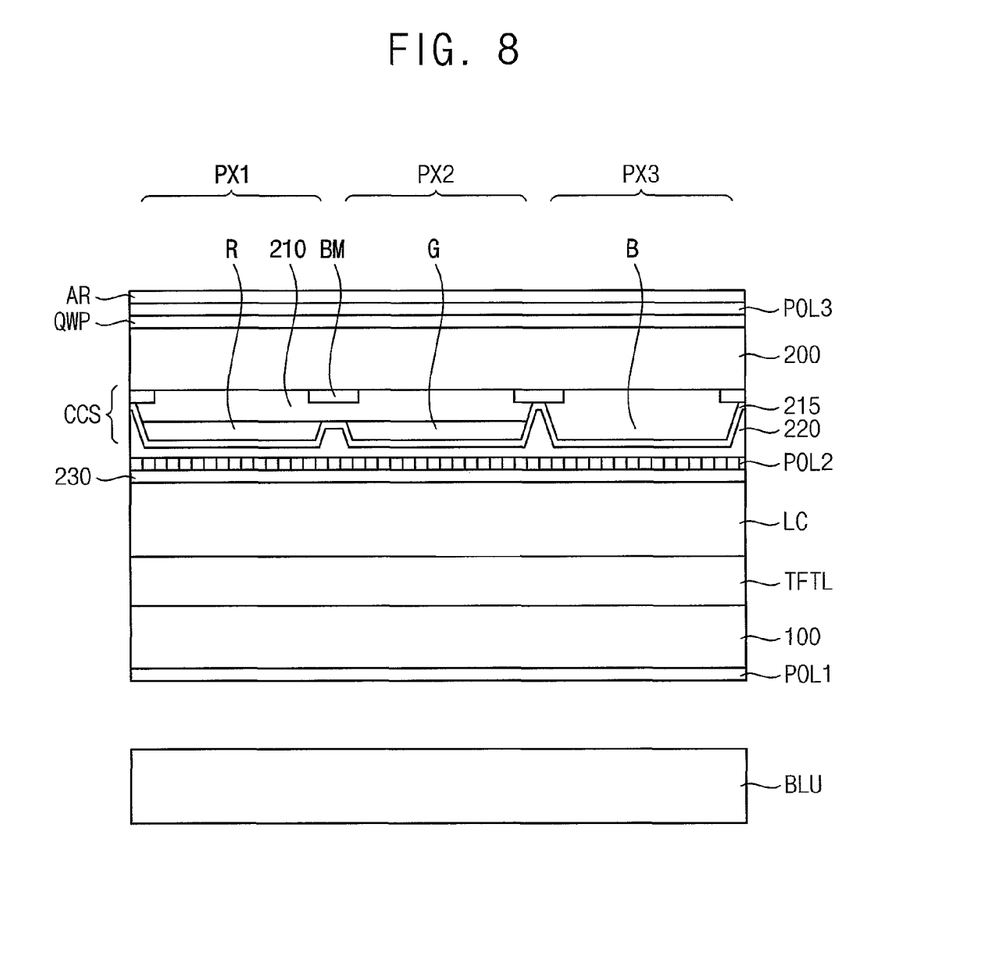
FIG. 8 is a cross-sectional view illustrating the display apparatus of FIG. 7.

FIG. 7 is an exploded perspective view illustrating still another example embodiment of elements of a display apparatus according to the invention. FIG. 8 is a cross-sectional view illustrating the display apparatus of FIG. 7.

Referring to FIGS. 7 and 8, the display apparatus may be substantially same as the display apparatus of FIGS. 5 and 6, except for a direction of a polarizing axis of a third polarizer POL3. Therefore, repeated description will be omitted.

The display apparatus may include a backlight unit BLU, a first polarizer POL1, a liquid crystal layer LC, a first base substrate 100, a thin film transistor layer TFTL, a liquid crystal layer LC, a capping layer 230, a second polarizer POL2, a planarization layer 220, a light recycling filter 215, a color conversion layer CCS, a light blocking pattern BM, a second base substrate 200, a ¼ wave plate QWP, a third polarizer POL3 and an anti-reflection film AR. The color conversion layer CCS may include a first color conversion pattern R, a second color conversion pattern G, a third color conversion pattern B and a blue light blocking pattern 210.

The polarizing axis of the third polarizer POL3 may be formed to be at an angle without being parallel to a polarizing axis of the second polarizer POL2. Thus, when the polarizing axis of the second polarizer POL2 is in parallel with a second direction D2, the polarizing axis of the third polarizer POL3 and the polarizing axis of the second polarizer POL2 may form an acute angle greater than 0 degrees and less than 90 degrees therebetween.

Here, a degree of transmission of the polarized blue light passing through the color conversion layer CCS can be adjusted according to the acute angle. Thus, when the acute angle size is 0 degrees, the polarized blue light can maximally pass through the third polarizer POL3. When the acute angle is 90 degrees, the polarized blue light minimally passes through the third polarizer POL3. The size of the acute angle can be determined in consideration of influence of the polarized blue light on the display quality of the display apparatus.

Figure 9A:
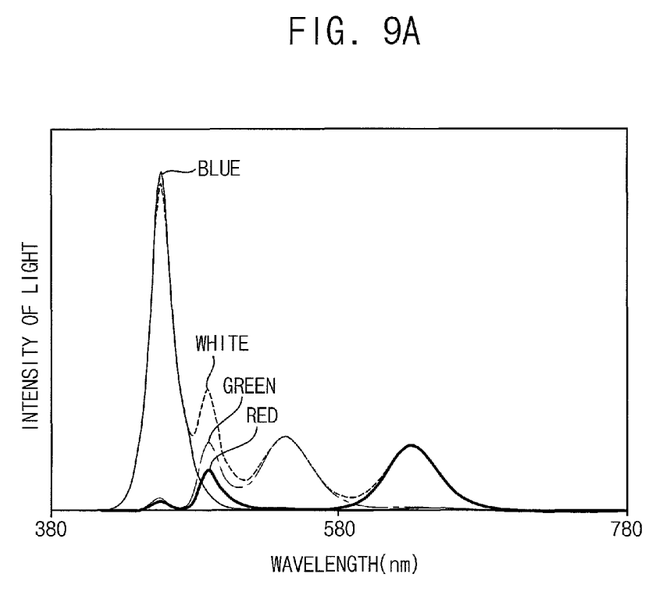
FIGS. 9A, 9B and 9C are graphs showing relative intensity of exiting light according to wavelengths.
Figure 9B:
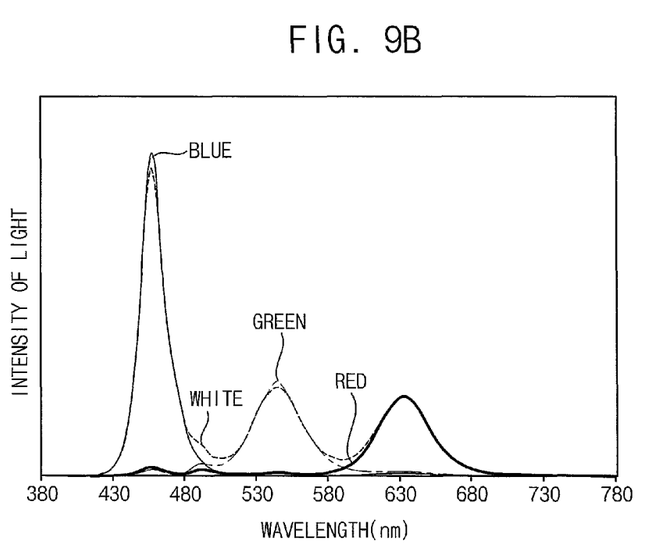
Figure 9C:
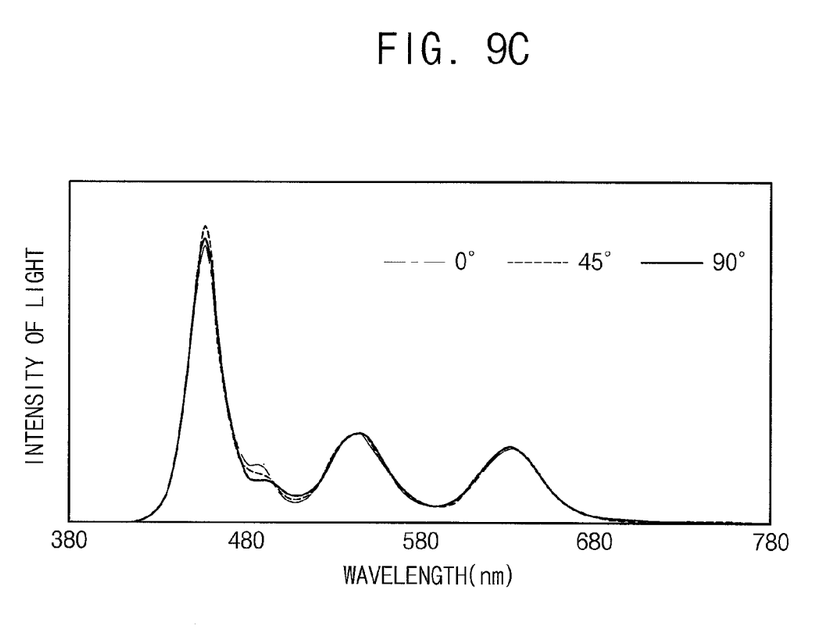

FIGS. 9A, 9B and 9C are graphs showing relative intensity of exiting light according to wavelengths in nanometers (nm).

FIG. 9A is a graph showing the relative intensity of light according to a wavelength of output light of a display apparatus including a color conversion layer using quantum dots according to a conventional structure of a color conversion layer.

Referring to FIG. 9A, when the display apparatus outputs white light, blue light (BLUE), green light (GREEN) and red light (RED) are mixed to form the white light. However, white light has an undesired cyan peak at a wavelength of about 500 nm between a peak of the blue light having a wavelength of about 450 nm and a peak of the green light having a wavelength of about 550 nm. As a result, a color coordinates of the display image may be undesirably deformed and display quality may deteriorate. The cyan peak may be formed due to output of unwanted polarized blue light as described above.

FIG. 9B is a graph showing the relative intensity of light according to the wavelength of output light of the display device of FIG. 2.

Referring to FIG. 9B, unlike the display apparatus of FIG. 9A, when the display apparatus of FIG. 2 outputs white light, the cyan peak may not be formed. This is because unwanted polarized blue light is blocked by the third polarizer POL3 as described above. Thus, the display quality of the display apparatus can be improved.

FIG. 9C is a graph showing the relative intensity of light according to the wavelength of the output light of the display apparatus according to the angle formed by the polarization axis of the third polarizer POL3 and the polarization axis of the second polarizer POL2.

When the angle between the polarization axes of the second and third polarizers POL2 and POL3 is 0 degrees, the unwanted polarized blue light is not blocked by the third polarizer POL3, so unwanted light having a wavelength of about 500 nm can be output. When the angle is 90 degrees, since the unwanted polarized blue light is blocked by the third polarizer POL3, the output of unwanted light having a wavelength of about 500 nm can be minimized. In addition, if necessary, the relative intensity of the output light having wavelength of about 500 nm can be adjusted by adjusting the angle. In FIG. 9C, the relative intensity of the output light is shown when the angle is 45 degrees, which is a value between a case where the angle is 0 degrees and a case where the angle is 90 degrees.

According to one or more example embodiment of the invention, a display apparatus includes a backlight unit generating light, a first polarizer disposed on the backlight unit, a third polarizer disposed on the first polarizer, a second polarizer disposed between the first polarizer and the third polarizer, a liquid crystal layer disposed between the first polarizer and the second polarizer, and a color conversion layer disposed between the second polarizer and the third polarizer and including a color conversion material that converts color of transmitted light. A polarizing axis of the third polarizer is not in parallel with a polarizing axis of the second polarizer. Accordingly, among the light that has been emitted from the backlight unit and has passed through the first polarizer, the liquid crystal layer, the second polarizer, and the color conversion layer, a light component which is converted into the non-polarized light by the color conversion structure in the color conversion layer can pass through the third polarizer, and light component which is not converted by the color conversion structure and has passed the second polarizer cannot pass through the third polarizer. Accordingly, only a desired light component can pass through the third polarizer, so that the display quality of the display device can be improved.

In addition, the display apparatus can obtain a desired output color coordinate by appropriately adjusting an angle formed by the polarization axis of the third polarizer and the polarization axis of the second polarizer.

In addition, the display apparatus may further include an anti-reflection film and/or a ¼ plate to minimize reflection of external light, thereby improving display quality.

The foregoing is illustrative of the invention and is not to be construed as limiting thereof. Although a few example embodiments of the invention have been described, those skilled in the art will readily appreciate that many modifications are possible in the example embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific example embodiments disclosed, and that modifications to the disclosed example embodiments, as well as other example embodiments, are intended to be included within the scope of the appended claims. The invention is defined by the following claims, with equivalents of the claims to be included therein.

What is claimed is:

1. A display apparatus, comprising:
    a backlight unit which generates light and provides the light to a display panel which displays an image with the light;
    a first polarizer disposed on the backlight unit;
    a third polarizer disposed on the first polarizer;
    a second polarizer disposed between the first polarizer and the third polarizer;
    a light transmittance layer which blocks or transmits the light therethrough to display the image, disposed between the first polarizer and the second polarizer; and
    a color conversion layer disposed between the second polarizer and the third polarizer, the color conversion layer comprising a color conversion material which converts a color of light transmitted through the light transmittance layer and the second polarizer,
    wherein a polarizing axis of the third polarizer is different from a polarizing axis of the second polarizer.

2. The display apparatus of claim 1, wherein the polarizing axis of the third polarizer is perpendicular to the polarizing axis of the second polarizer.

3. The display apparatus of claim 1, wherein
    the backlight unit generates blue light, and
    the color conversion layer comprises:
        a blue light blocking pattern which blocks the blue light,
        a first color conversion pattern comprising a first color conversion material which converts the blue light to red light at a red pixel area, and
        a second color conversion pattern comprising a second color conversion material which converts the blue light to green light at a green pixel area,
        wherein the blue light blocking pattern commonly overlaps the first color conversion pattern and the second color conversion pattern.

4. The display apparatus of claim 3, wherein the color conversion layer further comprises a third color conversion pattern which transmits the blue light therethrough at a blue pixel area, the third color conversion pattern comprising a scattering particle or blue pigment.

5. The display apparatus of claim 4, wherein
    the first polarizer converts the blue light from the backlight unit into polarized blue light to be incident to the light transmittance layer,
    the light transmittance layer and the second polarizer sequentially pass the polarized blue light therethrough to be incident on the color conversion layer,
    at the red pixel area, the first color conversion pattern converts a portion of the polarized blue light incident thereto into non-polarized red light and transmits a portion of the polarized blue light which is not blocked by the blue light blocking pattern, to be incident on the third polarizer at the red pixel area,
    at the green pixel area, the second color conversion pattern converts a portion of the polarized blue light incident thereto into non-polarized green light and transmits a portion of the polarized blue light which is not blocked by the blue light blocking pattern, to be incident on the third polarizer at the green pixel area, and
    at the blue pixel area, the third color conversion pattern converts a portion of the polarized blue light incident thereto into non-polarized blue light and transmits a remaining portion of the polarized blue light, to be incident on the third polarizer at the blue pixel area.

6. The display apparatus of claim 5, wherein the third polarizer:
    respectively converts the non-polarized red light, the non-polarized green light and the non-polarized blue light into polarized red light, polarized green light and polarized blue light, at the red pixel area, the green pixel area and the blue pixel area, and
    blocks the polarized blue light at each of the red pixel area, the green pixel area and the blue pixel area.

7. The display apparatus of claim 4, wherein the second polarizer is a wire grid polarizer,
    further comprising a planarization layer respectively between the second polarizer as the wire grid polarizer, and each of the first color conversion pattern, the second color conversion pattern and the third color conversion pattern.

8. The display apparatus of claim 7, further comprising a light recycling filter disposed between the planarization layer and the third polarizer, the light recycling filter respectively between the first color conversion pattern, the second color conversion pattern and the third color conversion pattern.

9. The display apparatus of claim 8, wherein the third polarizer is a polyvinyl alcohol polarizing plate,
further comprising a second base substrate disposed between the third polarizer as the polyvinyl alcohol polarizing plate and the color conversion layer.

10. The display apparatus of claim 1, wherein the first polarizer is a polyvinyl alcohol polarizing plate or a wire grid polarizer,
further comprising between the first polarizer as the polyvinyl alcohol polarizing plate or the wire grid polarizer, and the light transmittance layer:
a first base substrate; and
a thin film transistor layer disposed on the first base substrate, the thin film transistor layer comprising a thin film transistor and a pixel electrode which is electrically connected to the thin film transistor.

11. The display apparatus of claim 1, further comprising a quarter wave plate disposed between the third polarizer and the color conversion layer.

12. The display apparatus of claim 11, further comprising an anti-reflection film which disposes the third polarizer between the anti-reflection film and the quarter wave plate,
wherein the anti-reflection film comprises a first layer have a first refractive index repeatedly alternated with a second layer having a second refractive index which is higher than the first refractive index.

13. The display apparatus of claim 1, wherein the polarizing axis of the third polarizer and the polarizing axis of the second polarizer form an acute angle greater than 0 degrees and less than about 90 degrees.

14. The display apparatus of claim 1, wherein each of the first polarizer, the second polarizer and the third polarizer is a linear polarizer.

15. A display apparatus, comprising:
a backlight unit which generates blue light and provides the blue light to a display panel which displays an image with light;
a first polarizer disposed on the backlight unit;
a third polarizer disposed on the first polarizer;
a second polarizer disposed between the first polarizer and the third polarizer;
a light transmittance layer which blocks or transmits the light therethrough to display the image, disposed between the first polarizer and the second polarizer; and
a color conversion layer disposed between the second polarizer and the third polarizer, the color conversion layer comprising a color conversion material which converts a color of light transmitted through the light transmittance layer and the second polarizer,
wherein
a polarizing axis of the third polarizer is different from a polarizing axis of the second polarizer, and
the color conversion layer comprises:
a first color conversion pattern comprising a first color conversion material which converts the blue light to red light at a red pixel area,
a second color conversion pattern comprising a second color conversion material which converts the blue light to green light at a green pixel area,
a third color conversion pattern comprising a scattering particle, the third color conversion pattern transmitting blue light therethrough at a blue pixel area, and
a blue light blocking pattern which blocks the blue light, at the red pixel area and the green pixel area.

16. The display apparatus of claim 15, wherein the polarizing axis of the third polarizer is perpendicular to the polarizing axis of the second polarizer.

17. The display apparatus of claim 16, wherein
the first polarizer converts the blue light from the backlight unit into polarized blue light to be incident to the light transmittance layer,
the light transmittance layer and the second polarizer sequentially pass the polarized blue light therethrough to be incident on the color conversion layer,
at the red pixel area, the first color conversion pattern converts a portion of the polarized blue light incident thereto into non-polarized red light, and transmits a portion of the polarized blue light which is not blocked by the blue light blocking pattern, to be incident on the third polarizer at the red pixel area,
at the green pixel area, the second color conversion pattern converts a portion of the polarized blue light incident thereto into non-polarized green light, and transmits a portion of the polarized blue light which is not blocked by the blue light blocking pattern, to be incident on the second polarizer at the green pixel area, and
at the blue pixel area, the third color conversion pattern converts a portion of the polarized blue light incident thereto into non-polarized blue light, and transmits a remaining portion of the polarized blue light, to be incident on the third polarizer at the blue pixel area.

18. The display apparatus of claim 15, further comprising a quarter wave plate disposed between the third polarizer and the color conversion layer.

19. The display apparatus of claim 18, further comprising an anti-reflection film which disposes the third polarizer between the anti-reflection film and the quarter wave plate,
wherein the anti-reflection film comprises a first layer have a first refractive index repeatedly alternated with a second layer having a second refractive index which is higher than the first refractive index.

20. The display apparatus of claim 15, wherein the second polarizer is a wire grid polarizer,
further comprising:
a planarization layer respectively between the second polarizer as the wire grid polarizer, and each of the first color conversion pattern, the second color conversion pattern and the third color conversion pattern; and
a light recycling filter disposed between the planarization layer and the polarizer, the light recycling filter respectively between the first color conversion pattern, the second color conversion pattern and the third color conversion pattern.

* * * * *